(12) United States Patent
Kim et al.

(10) Patent No.: US 10,687,010 B2
(45) Date of Patent: Jun. 16, 2020

(54) SINGLE-SLOPE COMPARISON DEVICE WITH HIGH RESOLUTION AND LOW NOISE AND CMOS IMAGE SENSOR INCLUDING THE SAME

(71) Applicant: SK hynix Inc., Gyeonggi-do (KR)

(72) Inventors: Hyeon-June Kim, Jeollanam-do (KR); Min-Kyu Kim, Seoul (KR)

(73) Assignee: SK hynix Inc., Icheon-si (KR)

( * ) Notice: Subject to any disclaimer, the term of this patent is extended or adjusted under 35 U.S.C. 154(b) by 9 days.

(21) Appl. No.: 16/218,206

(22) Filed: Dec. 12, 2018

(65) Prior Publication Data

US 2019/0281244 A1 Sep. 12, 2019

(51) Int. Cl.
| | |
|---|---|
| H04N 5/378 | (2011.01) |
| H01L 27/146 | (2006.01) |
| H04N 5/3745 | (2011.01) |
| H04N 5/357 | (2011.01) |

(52) U.S. Cl.
CPC ......... *H04N 5/378* (2013.01); *H01L 27/1461* (2013.01); *H01L 27/14616* (2013.01); *H04N 5/357* (2013.01); *H04N 5/37455* (2013.01)

(58) Field of Classification Search
CPC .... H04N 5/378; H04N 5/37455; H04N 5/357; H01L 27/14616; H01L 27/1461
See application file for complete search history.

(56) References Cited

U.S. PATENT DOCUMENTS

| | | | | |
|---|---|---|---|---|
| 7,948,533 | B2* | 5/2011 | Koseki | H04N 5/3658 348/222.1 |
| 8,952,314 | B2* | 2/2015 | Park | H03M 1/16 250/208.1 |
| 9,479,787 | B2 | 10/2016 | Sato et al. | |
| 9,912,883 | B1* | 3/2018 | Lee | H04N 5/378 |
| 2015/0188561 | A1* | 7/2015 | Narayan | H03M 1/144 341/118 |
| 2015/0372688 | A1* | 12/2015 | Hashimoto | H03M 1/002 348/294 |

FOREIGN PATENT DOCUMENTS

KR 10-2013-0006137 A 3/2018

* cited by examiner

*Primary Examiner* — Luong T Nguyen
(74) *Attorney, Agent, or Firm* — Perkins Coie LLP (57) ABSTRACT

A comparison device includes a multi-step pixel signal generation circuit coupled to a pixel to receive a pixel signal and generate a multi-step pixel signal based on the pixel signal according to a multi-step trigger signal and a multi-step size control signal; a comparison circuit coupled to the multi-step pixel signal generation circuit to compare a ramp signal with the multi-step pixel signal and output a comparison signal; and a control circuit coupled to the multi-step pixel signal generation circuit and the comparison circuit to detect crossings of the multi-step pixel signal and the ramp signal based on the comparison signal from the comparison circuit and output the multi-step size control signal to the multi-step pixel signal generation circuit.

20 Claims, 7 Drawing Sheets

SINGLE-SLOPE COMPARISON DEVICE WITH HIGH RESOLUTION AND LOW NOISE AND CMOS IMAGE SENSOR INCLUDING THE SAME

CROSS-REFERENCE TO RELATED APPLICATION

This patent document claims the priority and benefits of Korean Patent Application No. 10-2018-0028107 filed on Mar. 9, 2018, which is incorporated herein by reference in its entirety.

TECHNICAL FIELD

The technology and implementations disclosed in this patent document relate to a complementary metal oxide semiconductor (CMOS) image sensor.

BACKGROUND

With the growing consumer demand for the high-resolution, low-noise digital imaging applications, CMOS image sensor manufacturers have been devoting themselves to the innovation in analog-to-digital conversion techniques such as multi-sampling techniques including multiple sampling of an input signal, analog-to-digital conversion, and averaging.

There is a trade-off relationship between the operating speed and power consumption of CMOS image sensors. In this regard, a 142366299.2 column-parallel structure is an optimal structure. However, there is a difficulty in integrating a readout circuit such as an analog-to-digital converter (ADC) into a narrow pixel width, Thus, a simple single-slope ADC is widely used in the column-parallel structure.

When a single-slope ADC uses a continuous time signal, optimal performance can be realized. However, if the continuous time signal becomes a discrete time signal in the middle of the analog-to-digital conversion, unwanted noise can be generated due to the coupling between adjacent columns. As the incident amount of light increases, shot noise becomes dominant in a high illumination period. Therefore, it is important to reduce noise in a low illumination period.

Various techniques are currently being studied to reduce such noise including determining a low illumination period and a high illumination period in advance to operate the CMOS image sensor in a high resolution mode during the low illumination period, changing a slope of a ramp signal, giving a time difference for the ramp signal to sample pixel signals multiple times, and making the ramp signal cross the pixel signal again, when a comparator determines that the pixel signal has crossed the ramp signal, by applying an offset to an input or output of the comparator.

SUMMARY

This patent document provides a single-slope comparison device which generates crossing events a plurality of times by globally applying an offset to a pixel signal at a predetermined timing during an analog-to-digital conversion (ADC) operation, and a CMOS image sensor including the same. The single-slope comparison device implemented based on various embodiments of the disclosed technology may obtain a multi-sampling effect by controlling a voltage of a pixel signal.

In an embodiment of the disclosed technology, a comparison device may include a multi-step pixel signal generation circuit coupled to a pixel to receive a pixel signal and generate a multi-step pixel signal based on the pixel signal according to a multi-step trigger signal and a multi-step size control signal; a comparison circuit coupled to the multi-step pixel signal generation circuit to compare a ramp signal with the multi-step pixel signal and output a comparison signal; and a control circuit coupled to the multi-step pixel signal generation circuit and the comparison circuit to detect crossings of the multi-step pixel signal and the ramp signal based on the comparison signal from the comparison circuit and output the multi-step size control signal to the multi-step pixel signal generation circuit.

In an embodiment of the disclosed technology, a complementary metal oxide semiconductor (CMOS) image sensor may include: a pixel array including a plurality of pixels each outputting a pixel signal corresponding to incident light; a row decoder coupled to the pixel array to select and control the plurality of pixels in the pixel array at each row line; a ramp signal generator structured to generate a ramp signal; a plurality of multi-step pixel signal generation circuits coupled to the pixel array to receive corresponding pixel signals from the pixel array and generate multi-step pixel signals according to a global multi-step trigger signal and a multi-step size control signal; a plurality of comparison circuits coupled to the plurality of multi-step pixel signal generation circuits to compare the ramp signal from the ramp signal generator with the multi-step pixel signals from the plurality of multi-step pixel signal generation circuits and output comparison signals; a plurality of control circuits coupled to the plurality of multi-step pixel signal generation circuits and the plurality of comparison circuits to detect crossings of the multi-step pixel signals and the ramp signal based on the corresponding comparison signals from the plurality of comparison circuits and output the multi-step size control signals to the plurality of corresponding multi-step pixel signal generation circuits; a counting circuit coupled to the plurality of comparison circuits to count a number of clock pulses according to the corresponding comparison signals from the plurality of comparison circuits; a memory circuit coupled to the counting circuit to store counting information from the counting unit; a control circuit structured to control operations of the row decoder, the ramp signal generator, the plurality of comparison circuits, the counting circuit, and the memory circuit; and a column readout circuit structured to output data stored in the memory circuit according to control signals of the control circuit.

In an embodiment of the disclosed technology, a comparison device may include: a multi-step pixel signal generation block suitable for generating a multi-step pixel signal according to a multi-step trigger signal and a multi-step size control signal; a comparison block suitable for comparing a ramp signal with the multi-step pixel signal from the multi-step pixel signal generation block and outputting a comparison signal; and a control block suitable for detecting crossing according to the comparison signal from the comparison block and outputting the multi-step size control signal to the multi-step pixel signal generation block.

In an embodiment of the disclosed technology, a complementary metal oxide semiconductor (CMOS) image sensor may include: a pixel array suitable for outputting a pixel signal corresponding to incident light; a row decoder suitable for selecting and controlling a pixel in the pixel array at each row line; a ramp signal generator suitable for generating a ramp signal; a plurality of multi step pixel signal generation blocks suitable for receiving a corresponding pixel signal from the pixel array and generating multi-step pixel signals according to a global multi-step trigger signal and a multi-step size control signal; a plurality of comparison blocks suitable for comparing the ramp signal from the ramp signal generator with the multi-step pixel signals from the plurality of multi-step pixel signal generation blocks and outputting comparison signals; a plurality of control blocks suitable for detecting crossing according to the corresponding comparison signals from the plurality of comparison blocks and outputting the multi-step size control signals to the plurality of corresponding multi-step pixel signal generation blocks; a counting unit suitable for counting a clock according to the corresponding comparison signals from the plurality of comparison blocks; a memory unit suitable for storing counting information from the counting unit; a control unit suitable for controlling operations of the row decoder, the ramp signal generator, the plurality of comparison blocks, the counting unit, and the memory unit; and a column readout circuit suitable for outputting data of the memory unit according to control of the control unit.

DETAILED DESCRIPTION

Figure 1:
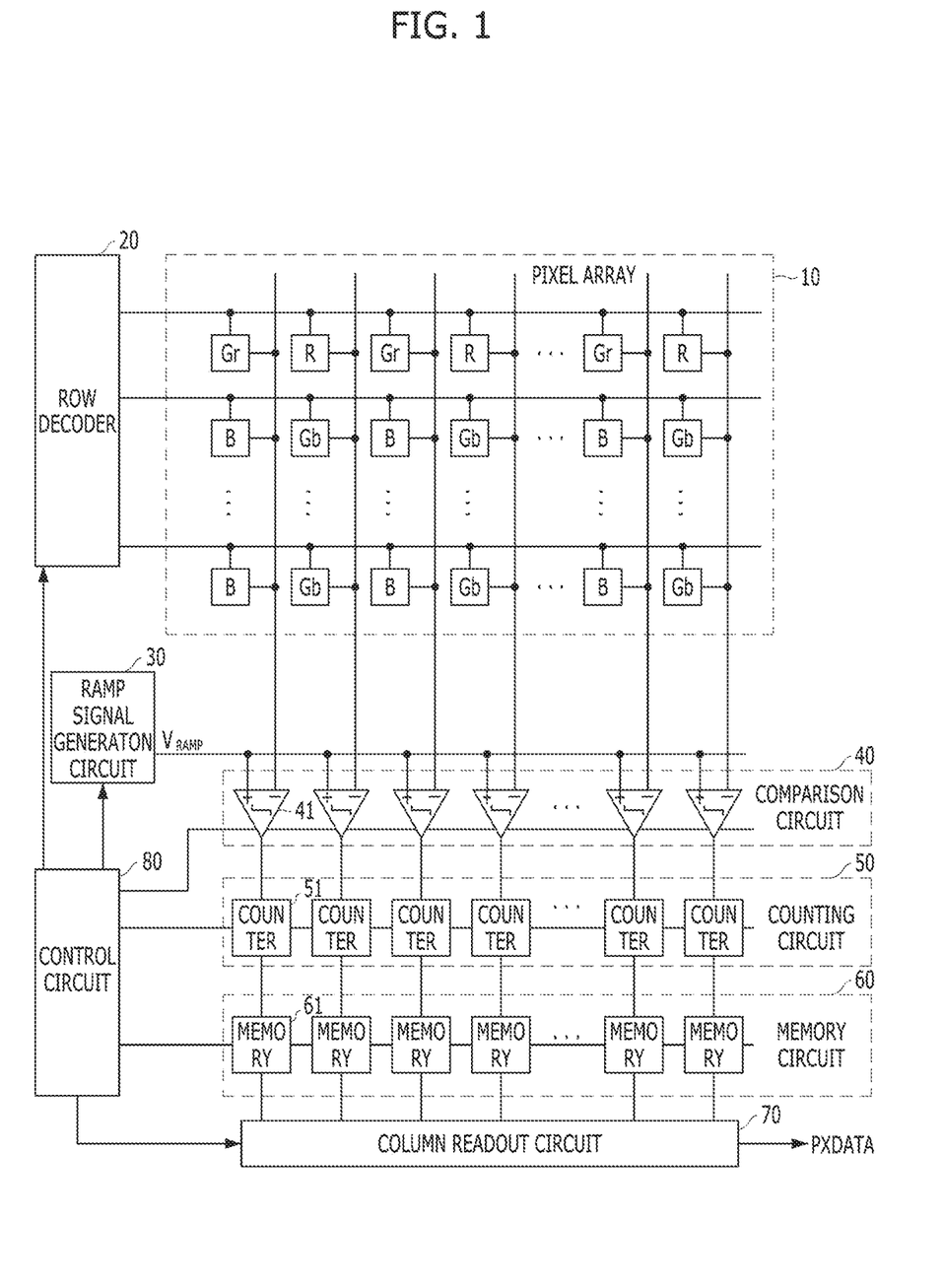
FIG. 1 is a configuration diagram of an example of a CMOS image sensor.

FIG. 1 is a diagram illustrating an example of a CMOS image sensor. The CMOS image sensor shown in FIG. 1 has a column parallel structure implemented using a single-slope analog-to-digital conversion device. The column-parallel structure may facilitate the high-speed readout of large pixel array without consuming much power, and the single-slope analog-to-digital conversion device is a good fit for the column-parallel structure because it can be implemented using a very simple column circuit and requires much less chip area than other types of analog-to-digital converter (ADC). For the column-parallel structure using a single-slope analog-to-digital conversion device or for other types of structures using different types of analog-to-digital conversion device, various embodiments of the disclosed technology may reduce noise by multi-sampling pixel signals.

Referring to FIG. 1, the CMOS image sensor includes a pixel array 10 of imaging pixels arranged in rows and columns, a row decoder 20, a ramp signal generation circuit 30, a comparison circuit 40, a counting circuit 50, a memory circuit 60, a column read-out circuit 70 and a control circuit 80.

Each imaging pixel may be implemented by a photo diode, a photo transistor, a photo gate, or other photosensitive circuitry capable of converting light into a pixel signal (e.g., a charge, a voltage or a current). On top of the imaging pixels, an array of different color filters is placed to cover the photosensing pixels to filter the incident light in different colors at different pixel locations to capture the color information in a sensed image. The specific example in FIG. 1 shows a pixel arrangement of colored imaging pixels labeled as "R" for a red colored pixel, "G" for a green colored pixel, and "B" for a blue colored pixel.

The pixel array 10 outputs pixel signals in response to incident light at individual imaging pixels. The row decoder 20 selects and controls pixels of the pixel array row by row. The ramp signal generation circuit 30 generates a ramp signal $V_{RAMP}$ in response to a control signal of the control circuit. The comparison circuit 40 compares the ramp signal $V_{RAMP}$ of the ramp signal generation circuit 40 with each pixel signal outputted from the pixel array 10.

The counting circuit 50 counts the number of clock pulses of the control circuit 80 according to output signals of the comparison circuit 40. The memory circuit 60 stores information (e.g., the number of clock pulses) provided by the counting circuit 50 according to instructions provided by the control circuit 80. The column read-out circuit 70 outputs sequentially the information stored in the memory circuit 60 as a pixel data PXDATA according to instructions provided by the control circuit 80. The control circuit 80 controls operations of the row decoder 20, the ramp signal generation circuit 30, the comparison circuit 40, the counting circuit 50, the memory circuit 60 and the column read-out circuit 70.

A CMOS image sensor may include the comparison circuit 40 that utilizes a correlated double sampling CDS technique to remove an offset value of the pixel.

The comparison circuit 40 includes a plurality of comparators 41, the counting circuit 50 includes a plurality of counters 51, and the memory circuit 60 includes a plurality of memories 61. In an example configuration, each column of the pixel array 10 includes the comparator 41, the counter 51 and the memory 61.

The operations of the comparator 41, the counter 51 and the memory 61 will be described with reference to FIG. 1 as below.

The comparator 41 has two input terminals that receive a pixel signal outputted from a column of the pixel array 10 and a ramp signal $V_{RAMP}$ outputted from the ramp signal generation circuit 30, respectively. The comparator 41 compares the ramp signal $V_{RAMP}$ with the pixel signal and outputs a comparison signal in response to a control signal provided by the control circuit 80.

Since a voltage level of the ramp signal $V_{RAMP}$ increases or decreases as time passes, the ramp signal $V_{RAMP}$ crosses the pixel signal at some point in time. After this crossing point, the value of the comparison signal outputted from the comparator 41 is inverted.

The counter 51 is used to count pulses during a period of time, for example, when the pixel signal is above the ramp signal. The counter 51 is initialized by a reset control signal of the control circuit 80.

The memory 61 stores information relating to the count (e.g., number of pulses) provided by the counter 51 and outputs the information to the column read-out circuit 70 according to control signals of the control circuit 80. Here, the CMOS image sensor may perform a counting operation on a reset signal (or a reset voltage) and then perform a counting operation on an image signal (a signal voltage).

Figure 2A:
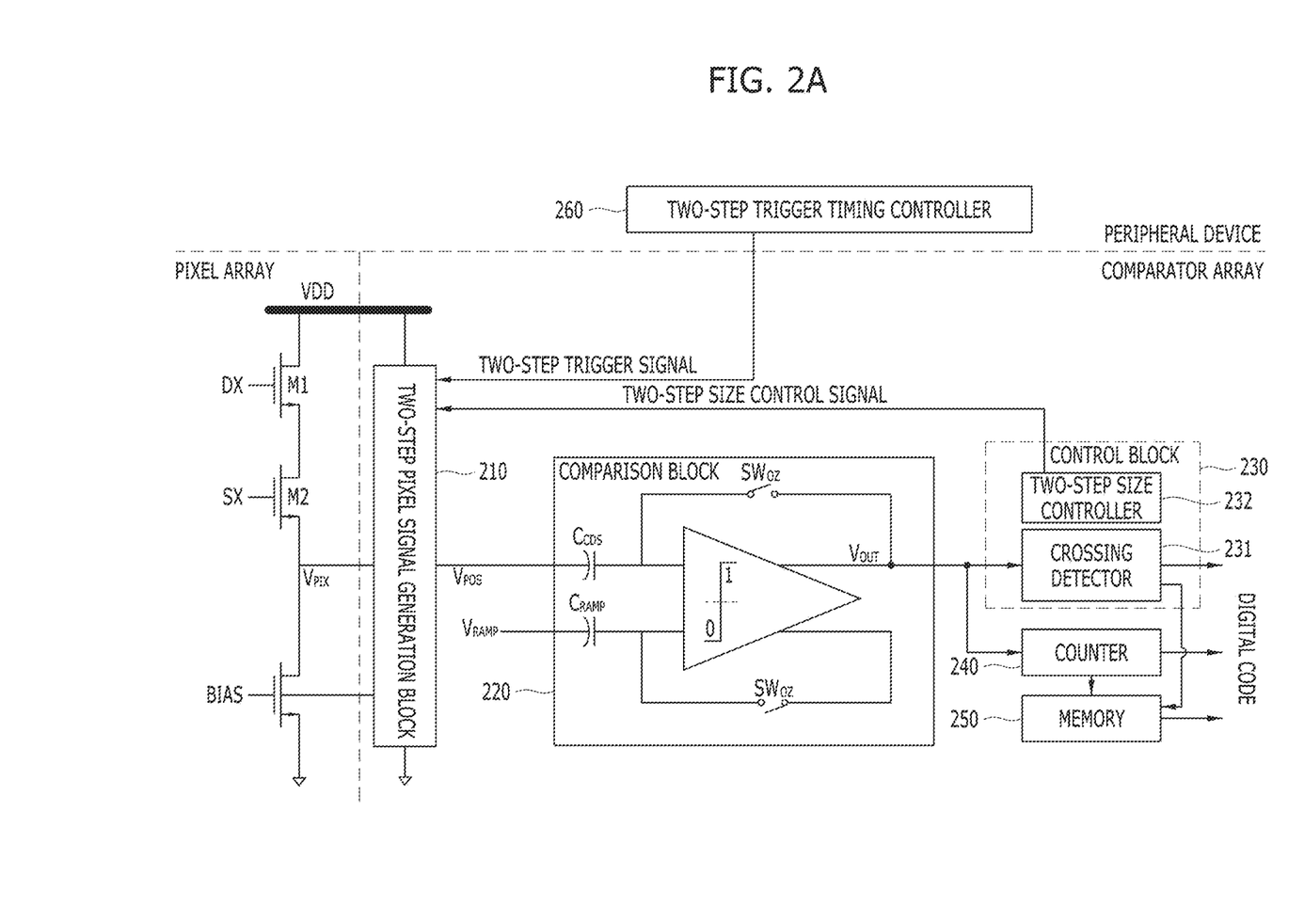
FIG. 2A is a diagram illustrating an example of a comparison device implemented based on an embodiment of the disclosed technology.

FIG. 2A is a diagram illustrating an example of a comparison device implemented based on an embodiment of the disclosed technology.

As illustrated in FIG. 2A, the comparator implemented based on an embodiment of the disclosed technology may include a two-step pixel signal generation circuit 210, a comparison circuit 220, and a control circuit 230. The two-step pixel signal generation circuit 210 may generate, based on the pixel signal, a two-step pixel signal $V_{POS}$ according to a two-step trigger signal and a two-step size control signal. The comparison circuit 220 may compare the ramp signal $V_{RAMP}$ with the two-step pixel signal $V_{POS}$ output from the two-step pixel signal generation circuit 210, and output a comparison signal. The control circuit 230 may detect crossings of two-step pixel signal $V_{POS}$ and the ramp signal $V_{RAMP}$ according to the comparison signal from the comparison circuit 220, and output the two-step size control signal to the two-step pixel signal generation circuit 210.

In an embodiment of the disclosed technology, the two-step pixel signal generation circuit 210 may modify an amplitude of the pixel signal while sampling the pixel signal based on the ramp signal $V_{RAMP}$. Although the term "two-step" has been used for convenience, the number of changes in the amplitude of the pixel signal during a sampling process of the pixel signal is not limited by the term "two-step." Rather, the term "two-step" may indicate that the amplitude of the pixel signal is modified multiple times during a sampling process of the pixel signal.

A detailed configuration of the two-step pixel signal generation circuit 210 will be described with reference to FIGS. 2B and 2D. The comparison circuit 220 may be implemented using a well-known comparator circuit, and thus a detailed description thereof will be omitted.

The control circuit 230 may include a crossing detector 231 and a two-step size controller 232. The crossing detector 231 may detect crossings of the two-step pixel signal $V_{POS}$ and the ramp signal $V_{RAMP}$ according to the comparison signal from the comparison circuit 220, and may determine an output timing of the comparison signal (e.g., a point in time when the comparison signal is output). The two-step size controller 232 may output the two-step size control signal having a predetermined voltage level to the two-step pixel signal generation circuit 210 at a predetermined timing. Here, the crossing detector 231 may determine whether the output timing of the comparison signal is before or after a two-step trigger timing, and generate flag information.

The comparator illustrated in FIG. 2A may include the two-step pixel signal generation circuit 210 between pixels M1 and M2 outputting the pixel signal $V_{PIX}$ and the input node of the comparison circuit 220 for performing analog-to-digital conversion on the pixel signal value, and may further include a two-step trigger timing controller 260 and a two-step size controller 232, which output a two-step trigger signal and a two-step size control signal, respectively, for driving the two-step pixel signal generation circuit 210.

The two-step trigger timing controller 260 may generate the two-step trigger signal and globally apply the two-step trigger signal to the two-step pixel signal generation circuit 210 of each column, and may be provided in a peripheral device or in a peripheral area of the CMOS image sensor (e.g., Peri-Block). The two-step size controller 232 may apply the two-step size control signal to the two-step pixel signal generation circuit 210 of the corresponding column, and may be provided in the control circuit 230 of each column channel. Here, the two-step size control signal may have a value that is fetched from an image signal processor (ISP) or a peripheral device or a register. For example, a predetermined value may be stored in a register to be used as the two-step size control signal. The two-step size controller 232 may be configured to output a two-step size control signal having a predetermined voltage level to the two-step pixel signal generation circuit 210 at a predetermined timing according to a clock or a control signal from an external control circuit such as a timing generator (not illustrated).

In addition, the crossing detector 231 may determine whether the value of the comparison signal output from the comparison circuit 220 has a certain value indicating there was a crossing of the pixel signal value and the ramp signal value before a two-step trigger timing or after the two-step trigger timing, and may be implemented with a latch circuit.

The crossing detector 231 may store flag information of a value "1" when the comparison circuit 220 outputs the comparison signal before the two-step trigger timing (e.g., when a crossing of the pixel signal value and the ramp signal value is detected before the two-step trigger timing). Here, the memory 250 may store a first counting value output from the counter 240, which is a digital value converted from an analog signal, according to a crossing detection signal from the crossing detector 231. The crossing detection signal from the crossing detector 231 may be used to enable the memory 250. When the two-step pixel signal generated by the two-step pixel signal generation circuit 210 is applied to the comparison circuit 220 at the two-step trigger timing, the counter 240 may start counting clock pulses again and output a second counting value, which is a digital value converted from an analog signal. The first counting value stored in the memory 250, the second counting value output from the counter 240, and the stored value of the crossing detector 231 may be averaged in the ISP to reduce noise. The averaging process may be performed in the ISP, but may also be performed by a logic circuit provided in the column.

The averaging calculation method may be implemented in various forms. Noise components of the signal value including the pixel signal, the ramp signal, and the two-step pixel signal may be averaged to improve a signal-to-noise ratio (SNR) as expressed by Equation 1 below.

$$(D_1+(D_2-D_F \times D_{TS}))/2 = D_{AVG} \quad \text{[Equation 1]}$$

Here, $D_1$ indicates the first counting value, $D_2$ indicates the second counting value, $D_F$ indicates the stored value of the crossing detector 231, and $D_{TS}$ indicates a step size (e.g., predetermined voltage value) applied to the pixel signal by the two-step pixel signal generation circuit 210.

The two-step pixel signal generation circuit 210 may adjust the step size according to the two-step size control signal from the two-step size controller 232. For example, the step size may be set to be larger than the value that the pixel signal has before applying two-step.

The crossing detector 231 may determine that the pixel signal is not in the low illumination when the comparison circuit 220 outputs the comparison signal because there is a crossing of the pixel signal value and the ramp signal value after the two-step trigger timing. This shows that a shot noise is larger than a thermal noise of the pixel signal. The low illumination (e.g., how low it is) may be regarded as the size of the pixel signal at the two-step trigger timing. Here, the crossing detector 231 may store and output the flag information of a value "0," the value counted by the counter 240 may not be stored in the memory 250, and the counter 240 may continue the counting and output the first counting value.

However, the step applied to the pixel signals in common at the two-step trigger timing leads to the changes in the comparison signal. Therefore, the changes should be subtracted from the final digital value converted from the analog signal. Therefore, the value of the counter 240 may be outputted as the first counting value, and the stored value of the crossing detector 231 may be outputted together and used for the subtraction process in the ISP. The subtraction process may be performed in the ISP, but may also be performed by a logic circuit provided in the column.

The subtraction calculation method may be implemented in various forms. For example, the subtraction calculation can be expressed as:

$$D_1 - (\overline{DF} \times D_{TS}) \qquad \text{[Equation 2]}$$

Here, D1 indicates the first counting value, $\overline{DF}$ indicates the stored value of the crossing detector 231, $D_{TS}$ indicates the step size (e.g., predetermined voltage value) applied to the pixel signal by the two-step pixel signal generation circuit 210.

As described above, an offset voltage is globally applied to the pixel signals at a predetermined timing during an analog-to-digital conversion operation. For example, the pixel signal is offset by a gate-source voltage (Vgs) of a transistor of the two-step pixel signal generation circuit 210. In this manner, when there has already been a crossing of the pixel signal and the ramp signal before a predetermined timing, a second crossing of the pixel signal and the ramp signal may occur by applying the offset voltage to the pixel signal.

While the offset voltage is being globally applied to the pixel signals at a predetermined timing, the ramp signal of the single-slope analog-to-digital converter, which has been decreasing or increasing linearly, maintains its value, and after the offset has been applied, the ramp signal continues to decrease or increase linearly, thereby minimizing coupling noise.

In addition, when there was no crossing before the predetermined timing, the offset voltage is applied to the pixel signals to obtain an analog-to-digital conversion code that is larger than the original pixel signal value by the offset voltage. However, this deficiency can be offset by setting the flag information as "1" when the crossing happens before applying the offset voltage and by setting the flag information as "0" when the crossing happens after applying the offset voltage.

Figure 2B:
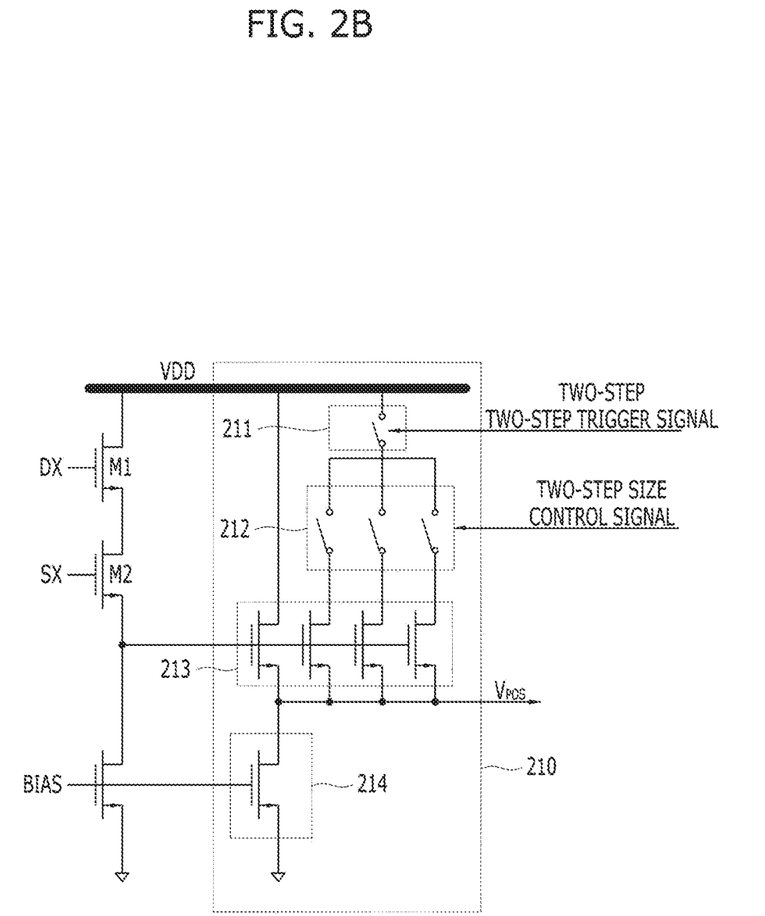
FIG. 2B is a circuit diagram illustrating an example of the two-step pixel signal generation block shown in FIG. 2A.

FIG. 2B is a circuit diagram illustrating an example of the two-step pixel signal generation circuit shown in FIG. 2A.

As illustrated in FIG. 2B, the two-step pixel signal generation circuit 210 may include a switch 211, a two-step size control circuit 212, a two-step signal generation circuit 213, and a bias circuit 214. The switch 211 may switch on/off according to the two-step trigger signal from the two-step trigger timing controller 260. The two-step size control circuit 212 may interwork with the switch 211 and control (adjust) the two-step size according to the two-step size control signal from the two-step size controller 232 of the control circuit 230. The two-step pixel signal generation circuit 213 may adjust the pixel signal coming from the pixel and generate the two-step pixel signal according to the two-step size control signals from the two-step size control circuit 212. The bias circuit 214 may interwork with the two-step pixel signal generation circuit 213.

The switch 211 is coupled between a terminal of a pixel power supply voltage VDD and the two-step size control circuit 212, and may apply or block the pixel power supply voltage VDD to the two-step size control circuit 212 according to the two-step trigger signal from the two-step trigger timing controller 260.

The two-step size control circuit 212 may include a plurality of switches each having one terminal coupled to the switch 211 and the other terminal coupled to the two-step pixel signal generation circuit 213, and may be turned on or off according to the two-step size control signal from the two-step size controller 232 and control the two-step size.

The two-step pixel signal generation circuit 213 may generate the two-step pixel signal by applying the offset voltage to the pixel signal coming from the pixel according to the two-step size control from the two-step size control circuit 212.

That is, the two-step pixel signal generation circuit 213 may control the amplitude of the pixel signal by using a voltage (Vgs) drop across the gate-source terminal of a source follower circuit according to the two-step size control from the two-step size control circuit 212.

In other words, the two-step pixel signal generation circuit 213 may include a source follower circuit that generates the two-step pixel signal by applying the offset voltage to the pixel signal from the pixel by using the gate-source voltage (Vgs) drop according to the two-step size control from the two-step size control circuit 212. For example, the source follower circuit may include a source follower transistor that drops the amplitude of the pixel signal being fed to a gate terminal of the source follower transistor by the gate-source voltage (Vgs) drop. In an example embodiment of the disclosed technology, the two-step pixel signal generation circuit 213 may include: one NMOS transistor having a drain terminal connected to the terminal supplying the pixel power supply voltage VDD, a gate terminal connected to the pixel, and a source terminal connected to the bias circuit 214; and a plurality of NMOS transistors each having a drain terminal connected to the two-step size control circuit 212, a gate terminal connected to the pixel, and a source terminal connected to the bias circuit 214.

The bias circuit 214 may include an NMOS transistor having a drain terminal connected to the two-step pixel signal generation circuit 213, a gate terminal to which a bias current is applied, and a source terminal connected to a ground power supply.

In an embodiment of the disclosed technology, the pixel signal can be controlled by additionally providing the source follower circuit at each column line. The pixel signal can be controlled by providing the two-step pixel signal generation circuit 213 including source follower transistors in the two-step pixel signal generation circuit 210 at each column. The comparison circuit 210 of the analog-to-digital converter receives the pixel signal coming from the pixel through the source follower circuit provided at each column line, instead of directly receiving the pixel signal from the pixel, so that the pixel signal can be more flexibly controlled in each column line.

Accordingly, the multi-sampling effect can be obtained by controlling the amplitude of the pixel signal by using the gate-source voltage (Vgs) drop of the source follower circuit.

Figure 2C:
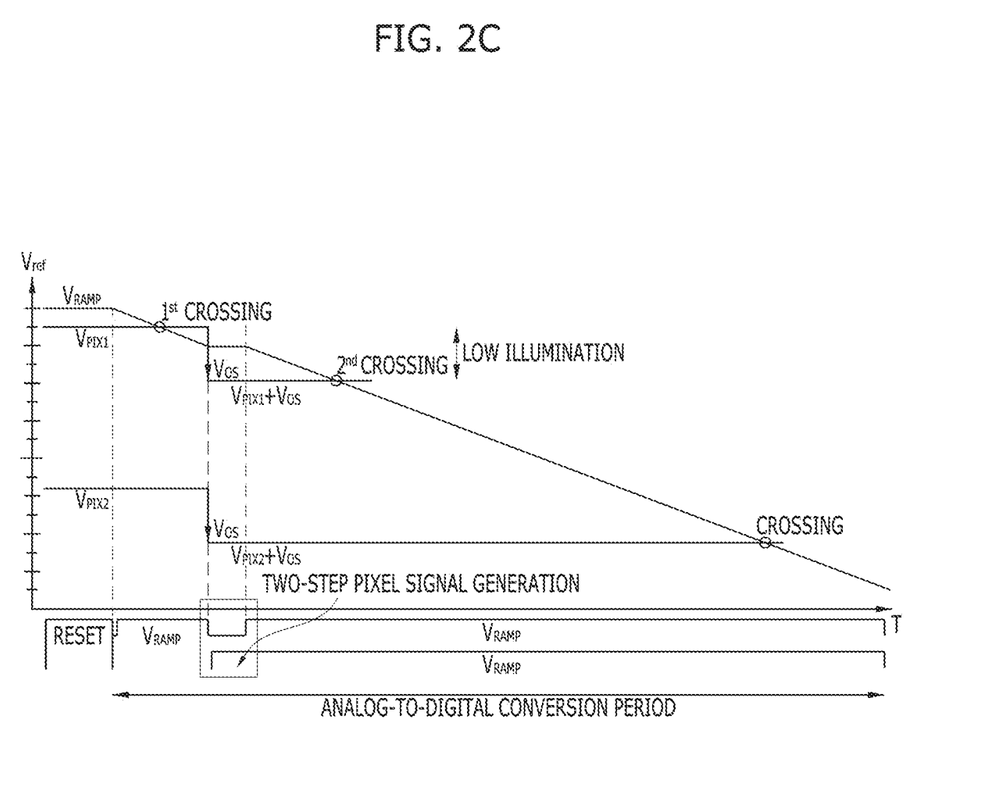
FIG. 2C is a timing diagram of the comparison device illustrated in FIGS. 2A and 2B.

FIG. 2C is a timing diagram of the comparison device illustrated in FIGS. 2A and 2B. X axis represents the operation timing, and Y axis represents the voltage.

In FIG. 2C, a first pixel signal $V_{PIX1}$ indicates a case where there is a crossing of the pixel signal value and the ramp signal value before the two-step trigger timing, and a second pixel signal $V_{PIX2}$ indicates a case where there is no crossing of the pixel signal value and the ramp signal before the two-step trigger timing. In an example embodiment of the disclosed technology, the ramp signal $V_{RAMP}$, may be a linearly increasing or decreasing signal that maintains its amplitude at the two-step trigger timing. As can be seen from FIG. 2C, there occur two crossings of the first pixel signal $V_{PIX1}$ and the ramp signal $V_{RAMP}$. Here, the comparison signal value indicates that there was a first crossing of the pixel signal value and the ramp signal before the two-step trigger timing, and thus the pixel signal value may be regarded as that of low illumination. After the step is applied to the pixel signal, the value of the first pixel signal $V_{PIX1}$ changes to $V_{PIX1}+V_{OS}$, and a second crossing of the first pixel signal $V_{PIX1}+V_{OS}$ and the ramp signal occurs. In FIG. 2C, there occurs no crossing between the second pixel signal $V_{PIX2}$ and the ramp signal $V_{RAMP}$ before the two-step trigger timing. The offset voltage $V_{OS}$ modifies the value of even when the comparison signal does not change (no crossing occurs) within the two-step trigger timing. This can be processed as simple offset.

Figure 2D:
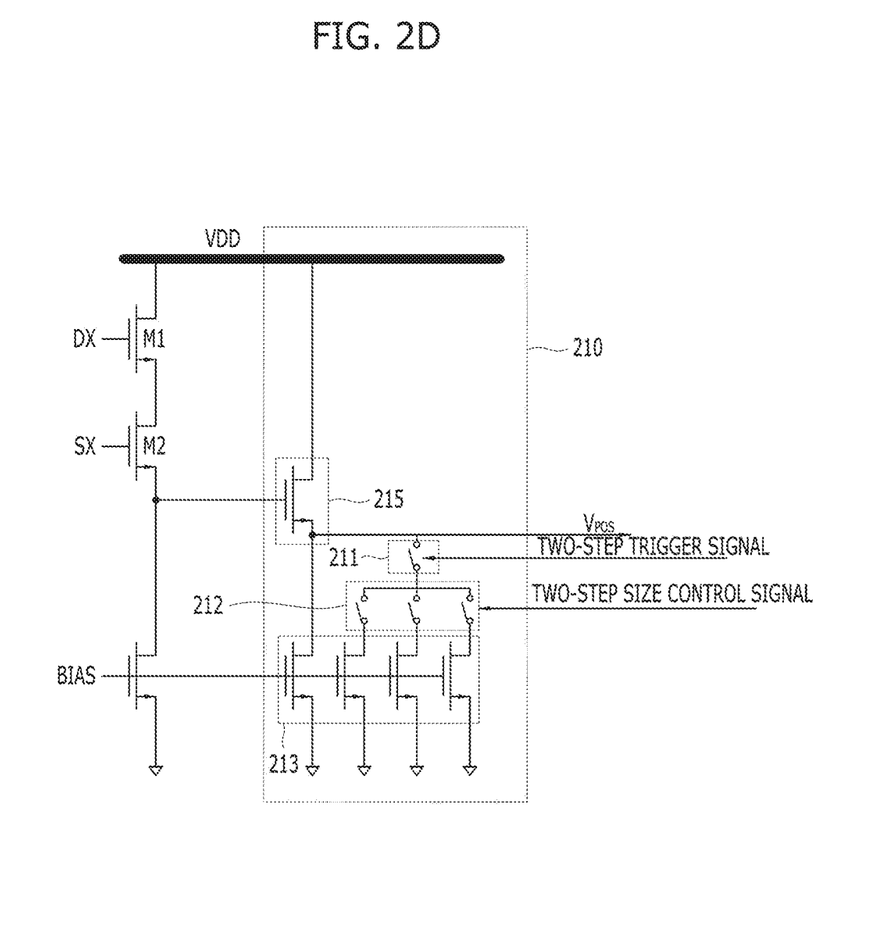
FIG. 2D is a circuit diagram illustrating another example of the two-step pixel signal generation block illustrated in FIG. 2A.

FIG. 2D is a circuit diagram illustrating another example of the two-step pixel signal generation circuit illustrated in FIG. 2A. Unlike the two-step pixel signal generation circuit illustrated in FIG. 2B, the two-step pixel signal generation circuit 213 is implemented by using a bias current. The operation, timing, and effect of the two-step pixel signal generation circuit 213 illustrated in FIG. 2D are the same as or similar to those of the two-step pixel signal generation circuit illustrated in FIG. 2B.

As illustrated in FIG. 2D, the two-step pixel signal generation circuit 210 may include a switch 211, a two-step size control circuit 212, and a two-step signal generation circuit 213. The switch 211 may switch according to the two-step trigger signal from the two-step trigger timing controller 260. The two-step size control circuit 212 may interwork with the switch 211 and control (adjust) the two-step size according to the two-step size control signal from the two-step size controller 232 of the control circuit 230. The two-step pixel signal generation circuit 213 may adjust the pixel signal from the pixel and generate the two-step pixel signal according to the two-step size control signals from the two-step size control circuit 212. The two-step pixel signal generation circuit 210 illustrated in FIG. 2D may further include a source follower circuit 215 which controls the pixel signal from the pixel.

The switch 211 is coupled between a source terminal of the source follower circuit 215 and the two-step size control circuit 212, and may be turned on or off according to the two-step trigger signal from the two-step trigger timing controller 260.

The two-step size control circuit 212 may include a plurality of switches each having one terminal coupled to the switch 211 and the other terminal coupled to the two-step pixel signal generation circuit 213, and may be turned on or off according to the two-step size control signal from the two-step size controller 232 and control the two-step size.

The two-step pixel signal generation circuit 213 may generate the two-step pixel signal by applying the offset voltage to the pixel signal outputted from the source follower circuit 215 according to the two-step size control from the two-step size control circuit 212.

In other words, the two-step pixel signal generation circuit 213 may include a bias circuit which generates the two-step pixel signal by applying the offset voltage to the pixel signal outputted from the source follower circuit 215 by using a voltage (Vgs) drop across the gate-source terminal of the source follower circuit 215 according to the two-step size control from the two-step size control circuit 212. For example, the source follower circuit may include a source follower transistor that drops the amplitude of the pixel signal being fed to a gate terminal of the source follower transistor by the gate-source voltage (Vgs) drop. In an example embodiment of the disclosed technology, the two-step pixel signal generation circuit 213 may include: one NMOS transistor having a drain terminal connected to a source terminal of the source follower circuit 215, a gate terminal to which the bias current is applied, a source terminal connected to a ground power supply; and a plurality of NMOS transistors each having a drain terminal connected to the two-step size control circuit 212, a gate terminal to which the bias current is applied, and a source terminal connected to the ground power supply.

The source follower circuit 215 may include an NMOS transistor having a drain terminal connected to a pixel power supply voltage VDD, a gate connected to the pixel, and a source terminal connected to the two-step pixel signal generation circuit 213.

Figure 3:
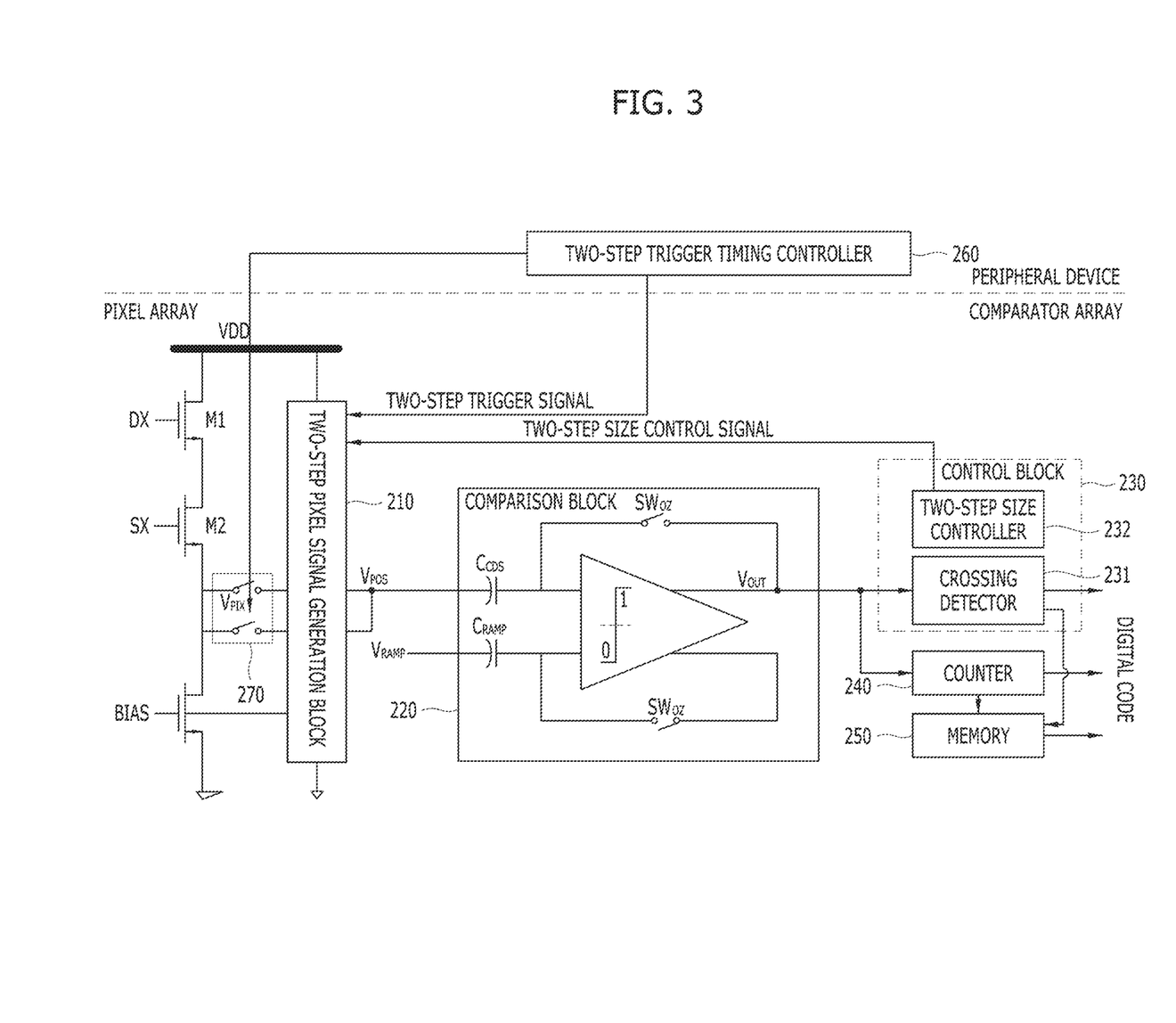
FIG. 3 is a diagram of a comparison device implemented based on another embodiment of the disclosed technology.

FIG. 3 is a diagram of a comparison device implemented based on another embodiment of the disclosed technology.

The disclosed technology may be implemented in various ways. For example, as illustrated in FIG. 3, a switching circuit 270 may be further provided in the comparator illustrated in FIG. 2A. The switching circuit 270 may pass or block the pixel signal being output from the pixel to the two-step pixel signal generation circuit 210 or the comparison circuit 220 according to control signals from the two-step trigger timing controller 260.

Although this patent document has used the term "two-step," some embodiments of the disclosed technology may be implemented by applying more than two-step. When the multi-sampling scheme discussed above is implemented using more than the two-step pixel signal adjustment, a column memory may be additionally required.

In some embodiments of the disclosed technology, a fixed pattern noise (FPN) may occur due to the added source follower circuit, but this can be offset through the digital double sampling (DDS) operation. In addition, an information value may be stored with one line memory by applying an optical black pixel (OBP) operation principle and may be subtracted.

Figure 4:
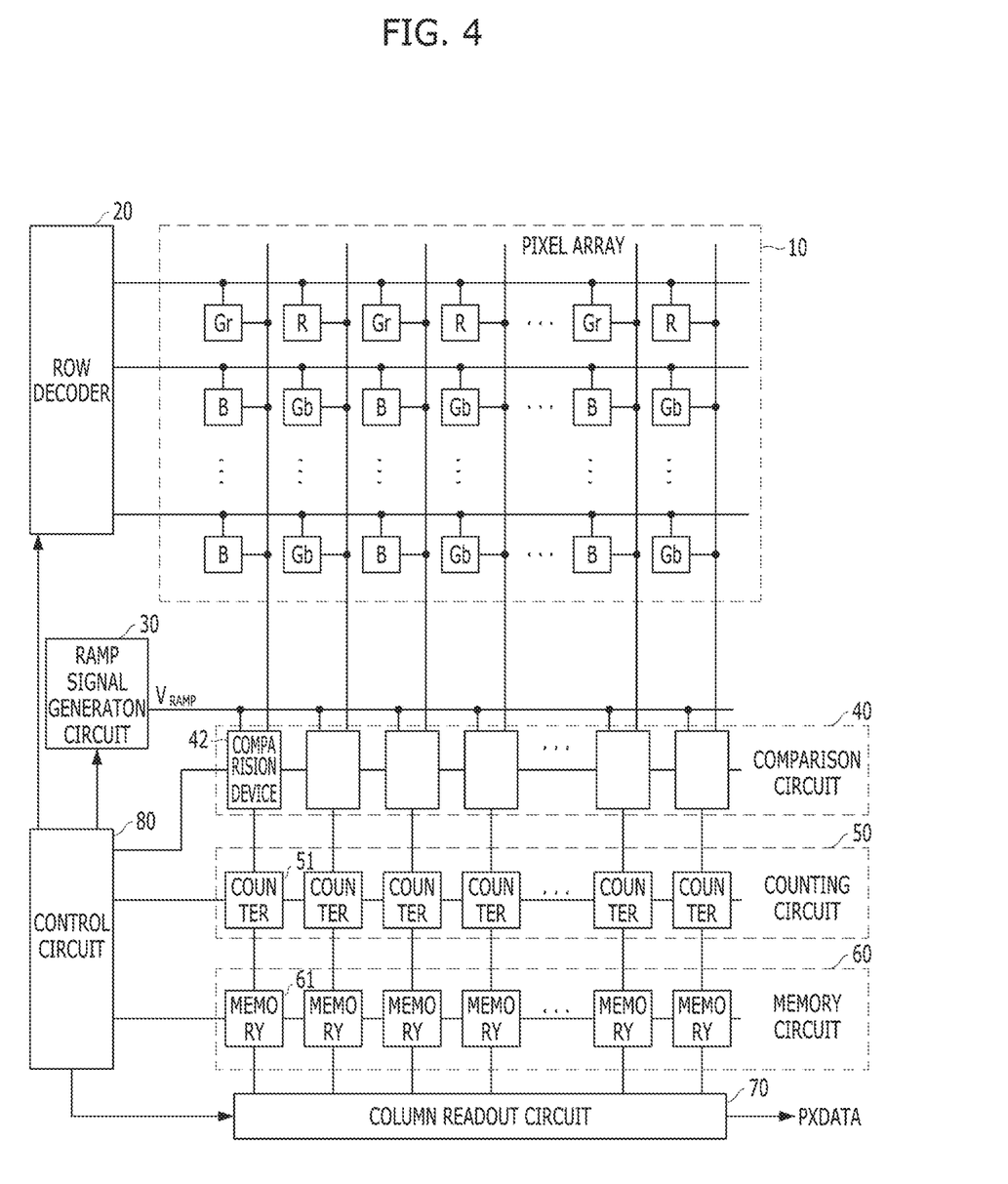
FIG. 4 is a diagram illustrating an example of a CMOS image sensor based on some embodiments of the disclosed technology.

FIG. 4 is a diagram an example of a CMOS image sensor implemented based on some embodiments of the disclosed technology.

As illustrated in FIG. 4, the CMOS image sensor implemented based on some embodiments of the disclosed technology includes a pixel array 10, a row decoder 20, a ramp signal generation circuit 30, a comparison circuit 40, a counting circuit 50, a memory circuit 60, a column read-out circuit 70, and a control circuit 80.

The pixel array 10 outputs pixel signals corresponding to incident light. The row decoder 20 selects and controls pixels of the pixel array row by row. The ramp signal generation circuit 30 generates a ramp signal $V_{RAMP}$ (including a coarse ramping signal and a fine ramping signal) in response to a control signal of the control circuit. The comparison circuit 40 compares the ramp signal $V_{RAMP}$ of the ramp signal generation circuit 40 with each pixel signal outputted from the pixel array.

The counting circuit 50 counts the number of clock pulses of the control circuit 80 according to output signals of the comparison circuit 40. The memory circuit 60 stores information (e.g., the number of clock pulses) provided by the counting circuit 50 according to instructions provided by the control circuit 80. The column read-out circuit 70 outputs sequentially the information stored in the memory circuit 60 as a pixel data PXDATA according to instructions provided by the control circuit 80. The control circuit 80 controls operations of the row decoder 20, the ramp signal generation circuit 30, the comparison circuit 40, the counting circuit 50, the memory circuit 60 and the column read-out circuit 70.

Here, the comparison circuit 40 includes the comparison device 42, which is implemented using the comparison device shown in FIG. 2A or the comparison device shown in FIG. 3.

The comparison circuit 40 may include a comparator 42 at each column, and a counter 51 and a memory 61 may be implemented in the same manner as the counter 240 and the memory 250 described with reference to FIG. 2.

In some embodiments of the disclosed technology, the multi-sampling effect can be obtained by controlling the voltage of the pixel signal in the single-slope ADC method.

That is, the multi-sampling effect can be obtained by generating crossing a plurality of times by globally applying the offset to the pixel signal at the predetermined timing during the ADC operation.

In addition, since the noise removal performance in the low illumination period is important, the noise removal performance can be improved by acquiring the multi-sampling effect as described above in the case of the low illumination pixel signal.

Although various embodiments and specific examples have been described, various changes and modifications may be made based on what is described and illustrated.

What is claimed is:

1. A comparison device comprising:
   a multi-step pixel signal generation circuit coupled to a pixel to receive a pixel signal and generate a multi-step pixel signal based on the pixel signal according to a multi-step trigger signal and a multi-step size control signal;
   a comparison circuit coupled to the multi-step pixel signal generation circuit to compare a ramp signal with the multi-step pixel signal and output a comparison signal; and
   a control circuit coupled to the multi-step pixel signal generation circuit and the comparison circuit to detect crossings of the multi-step pixel signal and the ramp signal based on the comparison signal from the comparison circuit and output the multi-step size control signal to the multi-step pixel signal generation circuit.

2. The comparison device of claim 1, wherein the control circuit comprises:
   a crossing detector coupled to the comparison circuit to detect the crossings of the multi-step pixel signal and the ramp signal according to the comparison signal from the comparison circuit and determine an output timing of the comparison signal; and
   a multi-step size controller coupled to the multi-step pixel signal generation circuit to output the multi-step size control signal having a predetermined voltage level to the multi-step pixel signal generation circuit at a predetermined timing.

3. The comparison device of claim 2, wherein the crossing detector determines whether the output time point of the comparison signal is before or after a multi-step trigger timing, and generates flag information.

4. The comparison device of claim 1, wherein the multi-step pixel signal generation circuit comprises:
   a switch coupled to a multi-step trigger timing controller to receive the multi-step trigger signal to switch on or off according to a multi-step trigger signal from the multi-step trigger timing controller;
   a multi-step size control circuit coupled to the switch to interwork with the switch and control a multi-step size according to the multi-step size control signal from the control circuit;
   a multi-step pixel signal generation circuit coupled to the pixel to receive the pixel signal and adjust the pixel signal according to the multi-step size control signal from the multi-step size control circuit and generate the multi-step pixel signal; and
   a bias circuit coupled to the multi-step pixel signal generation circuit to interwork with the multi-step pixel signal generation circuit.

5. The comparison device of claim 4, wherein the multi-step pixel signal generation circuit generates the multi-step pixel signal by applying an offset voltage to the pixel signal according to the multi-step size control signal from the multi-step size control circuit.

6. The comparison device of claim 4, wherein the multi-step pixel signal generation circuit includes a source follower circuit to adjust an amplitude of the pixel signal by using a gate-source voltage drop of the source follower circuit according to the multi-step size control from the multi-step size control circuit.

7. The comparison device of claim 4, wherein the multi-step pixel signal generation circuit generates the multi-step pixel signal by applying an offset voltage to the pixel signal from the pixel by using a gate-source voltage drop according to the multi-step size control signal from the multi-step size control circuit.

8. The comparison device of claim 4, wherein the multi-step pixel signal generation circuit comprises:
   an NMOS transistor having a drain terminal coupled to a pixel power supply voltage, a gate terminal coupled to the pixel, and a source terminal coupled to the bias circuit; and
   a plurality of NMOS transistors each having a drain terminal coupled to the multi-step size control circuit, a gate terminal coupled to the pixel, and a source terminal coupled to the bias circuit.

9. The comparison device of claim 1, wherein the multi-step pixel signal generation circuit comprises:
   a switch coupled to a multi-step trigger timing controller to receive the multi-step trigger signal to switch on or off according to a multi-step trigger signal from a multi-step trigger timing controller;
   a multi-step size control circuit coupled to the switch to interwork with the switch and control a multi-step size according to the multi-step size control signal from the control circuit; and
   the multi-step pixel signal generation circuit coupled to the pixel to receive the pixel signal and adjust the pixel signal according to the multi-step size control signal from the multi-step size control circuit and generate the multi-step pixel signal.

10. The comparison device of claim 9, wherein the multi-step pixel signal generation circuit further comprises a source follower circuit to adjust an amplitude of the pixel signal being output from the pixel.

11. The comparison device of claim 10, wherein the source follower circuit comprises an NMOS transistor having a drain terminal coupled to a pixel power supply voltage, a gate coupled to the pixel, and a source terminal coupled to the multi-step pixel signal generation circuit.

12. The comparison device of claim 10, wherein the multi-step pixel signal generation circuit generates the multi-step pixel signal by applying an offset voltage to a pixel signal outputted from the source follower circuit according to the multi-step size control signal from the multi-step size control circuit.

13. The comparison device of claim 1, wherein the multi-step pixel signal generation circuit receives the multi-step trigger signal generated by a multi-step trigger timing controller and globally applied.

14. The comparison device of claim 1, further comprising a switching circuit coupled between the pixel and the multi-step pixel signal generation circuit to pass or block the pixel signal from the pixel to the multi-step pixel signal generation circuit or the comparison circuit according to a control signal from a multi-step trigger timing controller.

15. A complementary metal oxide semiconductor (CMOS) image sensor comprising:
   a pixel array including a plurality of pixels each outputting a pixel signal corresponding to incident light;
   a row decoder coupled to the pixel array to select and control the plurality of pixels in the pixel array at each row line;
   a ramp signal generator structured to generate a ramp signal;
   a plurality of multi-step pixel signal generation circuits coupled to the pixel array to receive corresponding pixel signals from the pixel array and generate multi-step pixel signals according to a global multi-step trigger signal and a multi-step size control signal;
   a plurality of comparison circuits coupled to the plurality of multi-step pixel signal generation circuits to compare the ramp signal from the ramp signal generator with the multi-step pixel signals from the plurality of multi-step pixel signal generation circuits and output comparison signals;
   a plurality of control circuits coupled to the plurality of multi-step pixel signal generation circuits and the plurality of comparison circuits to detect crossings of the multi-step pixel signals and the ramp signal based on the corresponding comparison signals from the plurality of comparison circuits and output the multi-step size control signals to the plurality of corresponding multi-step pixel signal generation circuits;
   a counting circuit coupled to the plurality of comparison circuits to count a number of clock pulses according to the corresponding comparison signals from the plurality of comparison circuits;
   a memory circuit coupled to the counting circuit to store counting information from the counting unit;
   a control circuit structured to control operations of the row decoder, the ramp signal generator, the plurality of comparison circuits, the counting circuit, and the memory circuit; and
   a column readout circuit structured to output data stored in the memory circuit according to control signals of the control circuit.

16. The CMOS image sensor of claim 15, wherein each of the plurality of control circuits comprises:

a crossing detector coupled to the plurality of comparison circuits to detect crossings of the multi-step pixel signal and the ramp signal according to the comparison signals from the corresponding comparison circuits and determine an output timing of the comparison signal; and
   a multi-step size controller suitable for outputting the multi-step size control signal having a predetermined voltage level to the corresponding multi-step pixel signal generation circuits at a predetermined timing.

17. The CMOS image sensor of claim 15, wherein each of the plurality of multi-step pixel signal generation circuits comprises:
   a switch coupled to a multi-step trigger timing controller to receive the multi-step trigger signal to switch on or off according to a multi-step trigger signal from the multi-step trigger timing controller;
   a multi-step size controller coupled to the switch interwork with the switch and control a multi-step size according to the multi-step size control signal from the corresponding control circuit;
   a multi-step pixel signal generation circuit coupled to the pixel array to receive the pixel signal and adjust the pixel signal according to the multi-step size control signal from the multi-step size controller and generating a multi-step pixel signal; and
   a bias circuit suitable for interworking with the multi-step pixel signal generation circuit.

18. The CMOS image sensor of claim 17, wherein the multi-step pixel signal generation circuit includes a source follower circuit to adjust an amplitude of the pixel signal by using a gate-source voltage drop of the source follower circuit according to the multi-step size control signal from the multi-step size controller.

19. The CMOS image sensor of claim 15, wherein each of the plurality of multi-step pixel signal generation circuits comprises:
   a switch coupled to a multi-step trigger timing controller to receive the multi-step trigger signal to switch on or off according to a multi-step trigger signal from a multi-step trigger timing controller;
   a multi-step size control circuit coupled to the switch to interwork with the switch and control a multi-step size according to the multi-step size control signal from the corresponding control circuit; and
   a multi-step pixel signal generation circuit coupled to the pixel to receive the pixel signal and adjust the pixel signal according to the multi-step size control signal from the multi-step size control circuit and generate the multi-step pixel signal.

20. The CMOS image sensor of claim 19, wherein the multi-step pixel signal generation circuit further comprises a source follower circuit to adjust an amplitude of the pixel signal being output from the pixel.

* * * * *